(12) United States Patent
Lai

(10) Patent No.: US 8,405,987 B2
(45) Date of Patent: Mar. 26, 2013

(54) COOLING SYSTEM FOR ELECTRONIC DEVICE AND ELECTRONIC DEVICE HAVING SAME

(75) Inventor: Yu-Chia Lai, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 213 days.

(21) Appl. No.: 13/011,981

(22) Filed: Jan. 24, 2011

(65) Prior Publication Data
US 2012/0134113 A1    May 31, 2012

(30) Foreign Application Priority Data
Nov. 25, 2010    (TW) .............................. 99140690 A

(51) Int. Cl.
*H05K 7/20* (2006.01)
(52) U.S. Cl. ................ 361/695; 361/679.48; 361/679.5; 361/697; 165/80.3; 165/104.33; 165/122; 165/126; 454/184
(58) Field of Classification Search .. 361/679.46–679.5, 361/690–697, 717–727; 165/80.2–80.4, 165/121–126, 104.33, 185; 454/184; 174/16.3, 252
See application file for complete search history.

(56) References Cited

U.S. PATENT DOCUMENTS

| | | | | |
|---|---|---|---|---|
| 5,822,188 A * | 10/1998 | Bullington | .................... | 361/695 |
| 6,330,154 B1 * | 12/2001 | Fryers et al. | .................. | 361/695 |
| 6,442,024 B1 * | 8/2002 | Shih | .............................. | 361/695 |
| 6,504,718 B2 * | 1/2003 | Wu | .............................. | 361/695 |
| 6,643,131 B1 * | 11/2003 | Huang | .......................... | 361/697 |
| 6,654,244 B2 * | 11/2003 | Laufer et al. | .................. | 361/695 |
| 7,209,352 B2 * | 4/2007 | Chen | ............................. | 361/695 |
| 7,408,773 B2 * | 8/2008 | Wobig et al. | ................. | 361/695 |
| 7,457,114 B2 * | 11/2008 | Peng et al. | ............... | 361/679.48 |
| 7,611,402 B2 * | 11/2009 | McClellan et al. | ........... | 454/184 |
| 7,742,296 B2 * | 6/2010 | Lai et al. | .................... | 361/679.5 |
| 7,990,706 B2 * | 8/2011 | Miyahara et al. | ............. | 361/695 |

* cited by examiner

*Primary Examiner* — Michail V Datskovskiy
(74) *Attorney, Agent, or Firm* — Altis Law Group, Inc.

(57) ABSTRACT

A cooling system includes a fan and an air conducting cover. The air conducting cover includes a first airflow channel and an opposite second airflow channel. The first airflow channel includes a first air inlet and an opposite first air outlet, the second airflow channel includes a second air inlet and an opposite second air outlet. The first air inlet and the second air inlet are both aligned with the fan.

10 Claims, 4 Drawing Sheets

COOLING SYSTEM FOR ELECTRONIC DEVICE AND ELECTRONIC DEVICE HAVING SAME

BACKGROUND

1. Technical Field

The disclosure generally relates to cooling systems for electronic devices.

2. Description of Related Art

In an electronic device, such as a server, there are many electronic components which generate heat when the electronic device operates. In designing a electronic device, cooling systems are employed to dissipate heat generated by the electronic components to prevent the electronic components from failure from overheating.

A typical cooling system includes an air conducting cover defining an airflow channel, a fan and electronic components mounted in the airflow channel. The fan is configured to draw air into the airflow channel and force air past the electronic components which are cooled accordingly. However, with increased functionality, the number of electronic components increases beyond the cooling capability of the airflow channel. Some electronic components must be located outside of the airflow channel and require additional fans to cool them. As a result, power consumption of the electronic device increases and the additional fans will generate considerable noise during operation.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary cooling system and electronic device having the cooling system. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
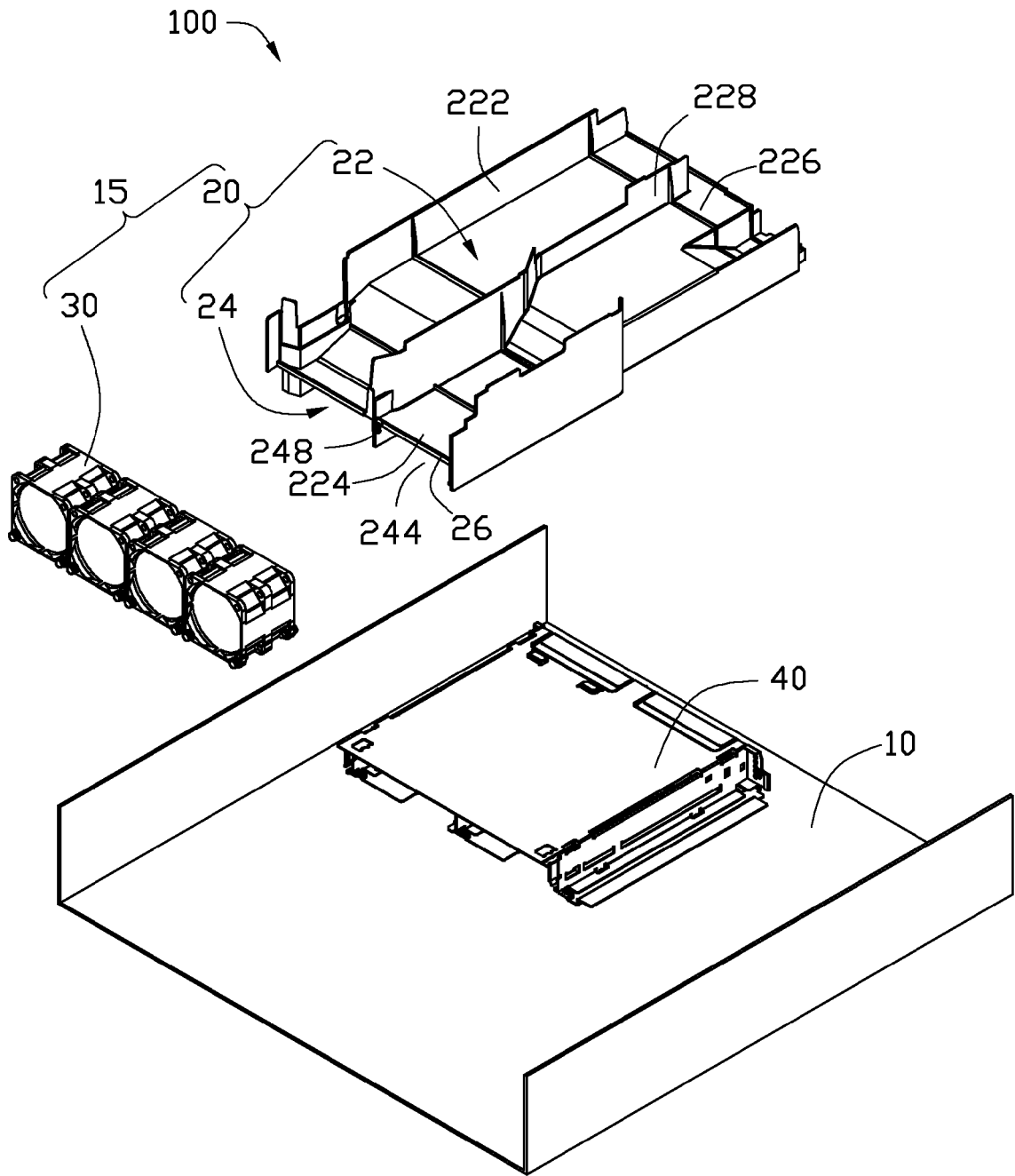
FIG. 1 is an exploded view of an embodiment of a cooling system, and an electronic device.
Figure 2:
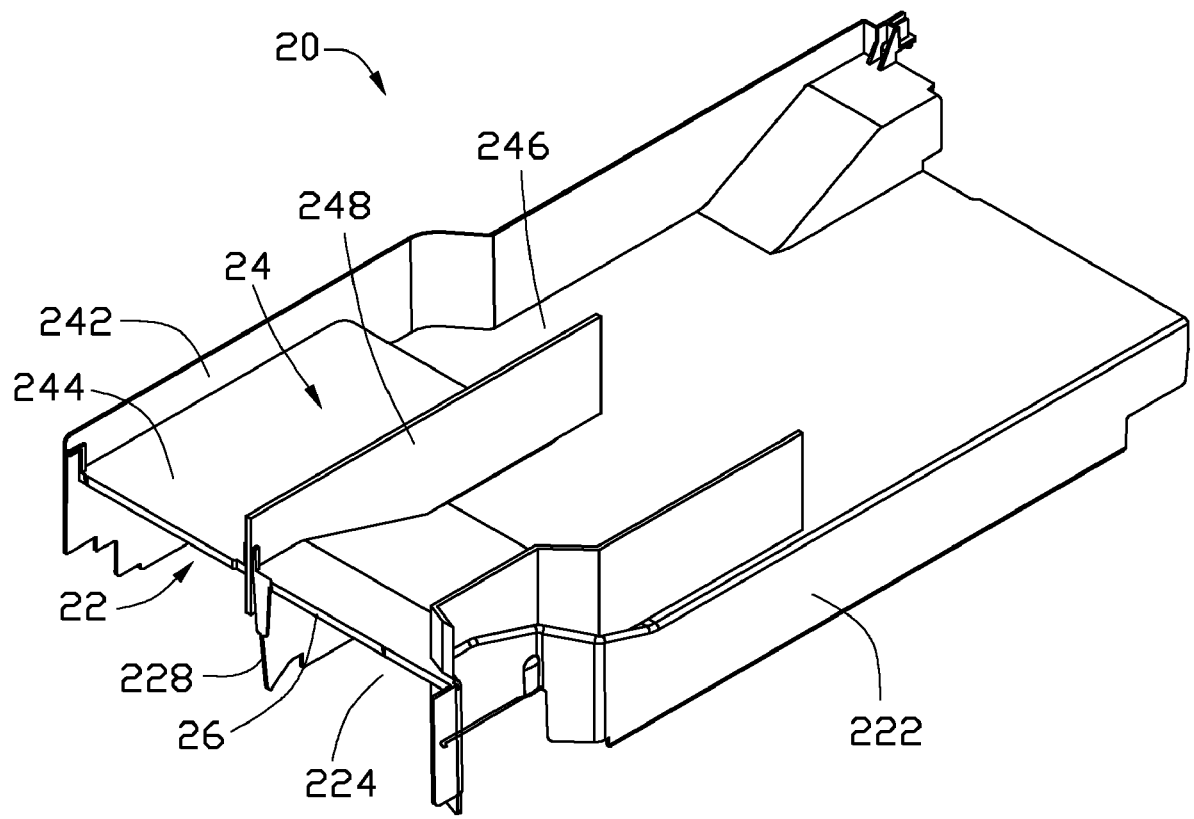
FIG. 2 is a schematic view of an air conducting cover of the cooling system in FIG. 1 seen from another aspect.

Referring to FIG. 1 and FIG. 2, an electronic device 100 includes a chassis 10, a plurality of first electronic components (not shown), a plurality of second electronic components 40 and a cooling system 15. The first electronic components, the second electronic components 40 and the cooling system 15, are all mounted in the chassis 10.

The cooling system 15 includes an air conducting cover 20 and a fan set 30. The air conducting cover 20 is mounted in the chassis 10, and includes two sidewalls 222 and a dividing wall 26 connecting the two sidewalls 222, from an area adjacent the center of their respective inwardly facing wall surfaces. The sidewalls 222 and the dividing wall 26 cooperatively form a first airflow channel 22 at one side of the dividing wall 26 and an opposite second airflow channel 24 at an opposite side of the dividing wall 26. The first airflow channel 22 further includes a first air inlet 224 and an opposite first air outlet 226, respectively located at opposite ends of the first airflow channel 22 and communicating with the first airflow channel 22. The second airflow channel 24 further includes a second air inlet 244 and an opposite second air outlet 246, respectively located at opposite ends of the second airflow channel 24 communicating with the second airflow channel 24. The air conducting cover 20 may further include a first partition board 228 extending substantially the length of the air conducting cover 20 from the first air inlet 224 to the first air outlet 226 and located in the first airflow channel 22, dividing the first airflow channel 22 into two channels. The air conducting cover 20 may further includes a second partition board 248 extending substantially the length of the air conducting cover 20 from the second air inlet 244 to the second air outlet 246 and located in the second airflow channel 24, dividing the second airflow channel 24 into two.

Figure 3:
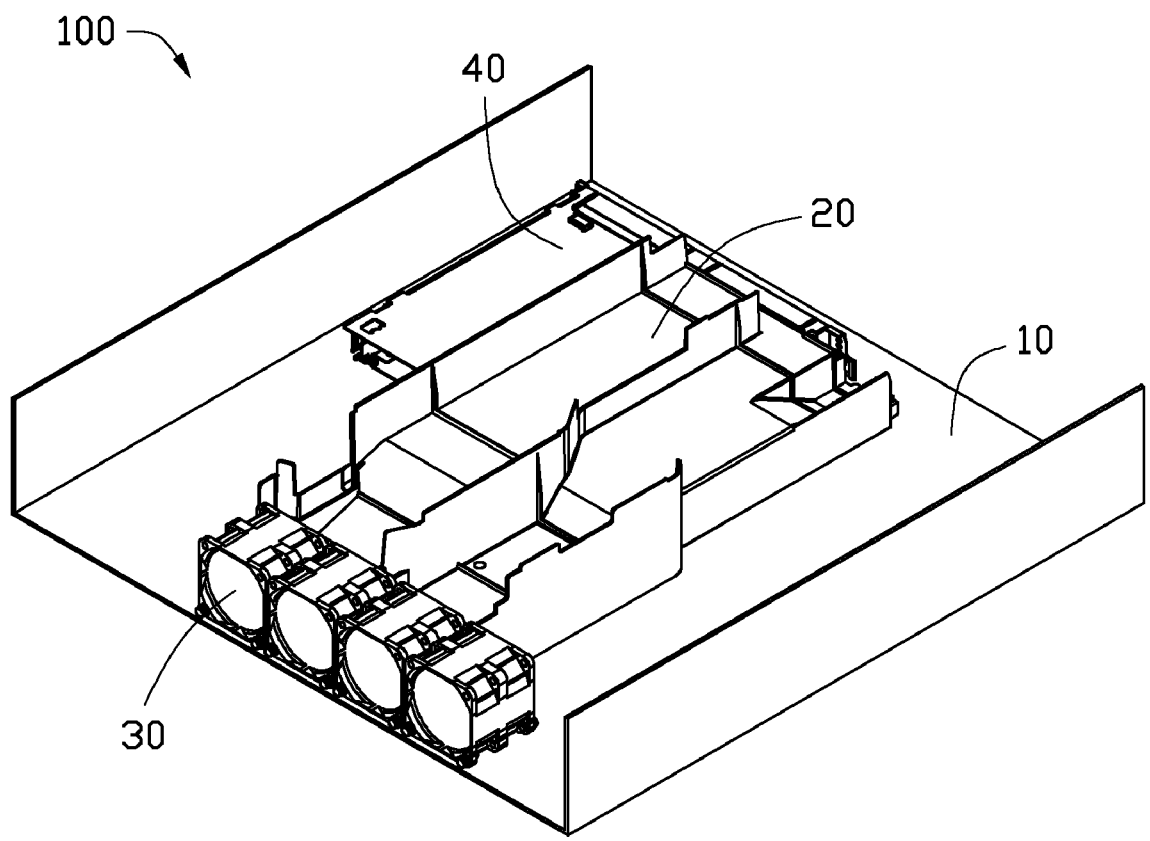
FIG. 3 is an assembled view of the electronic device in FIG. 1.

Referring to FIG. 3, the fan 30 mounted in the chassis 10 is simultaneously aligned with the first air inlet 224 and the second air inlet 244. The first electronic components are located in the first airflow channel 22, and the second electronic components are located in the second airflow channel 24.

Figure 4:
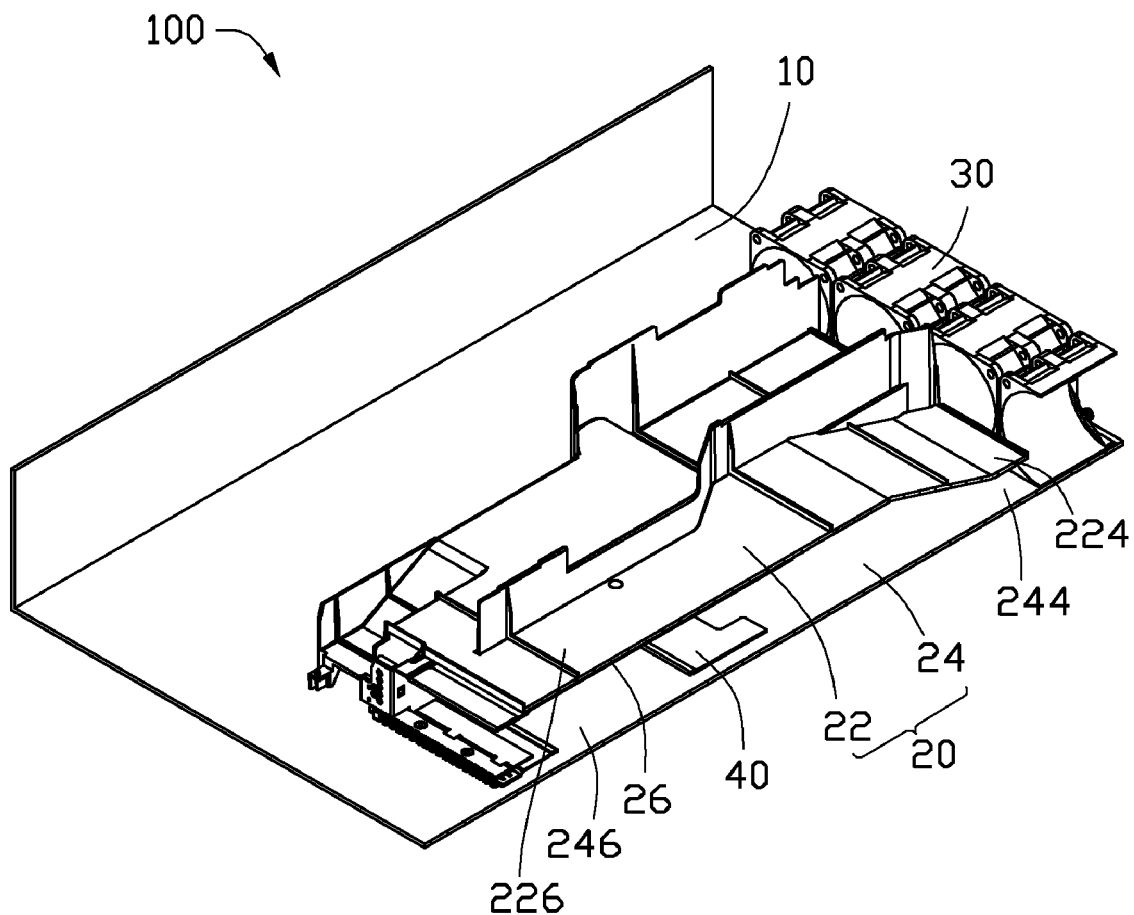
FIG. 4 is a cross-section of the electronic device in FIG. 3.

Referring to FIGS. 3 and 4, in operation, airflow from the fan set 30 simultaneously travels through the first airflow channel 22 and the second airflow channel 24 respectively from the first air inlet 224 and the second air inlet 244, and then out of the chassis 10 correspondingly via the first air outlet 226 and the second air outlet 246 so that the first electronic components and the second electronic components 40 are simultaneously cooled. Thus, fewer fans of the fan set 30 are required due to the presence of both the first airflow channel 22 and the second airflow channel 24.

It is to be understood, however, that even through numerous characteristics and advantages of the disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A cooling system, comprising:

a fan; and an air conducting cover comprising a first airflow channel and an adjacent second airflow channel, the first airflow channel comprising a first air inlet and an opposite first air outlet, the second airflow channel comprising a second air inlet and an opposite second air outlet;

wherein the air conducting cover includes two sidewalls having inwardly facing wall surfaces and a dividing wall connecting the two sidewalls from an area adjacent the center of their respective inwardly facing wall surfaces, the inwardly facing wall surfaces of the sidewalls and the dividing wall cooperatively form the first airflow channel at one side of the dividing wall and the second airflow channel at an opposite side of the dividing wall;

wherein the first air inlet and the second air inlet are both aligned with the fan.

2. The cooling system as claimed in claim 1, further comprising a first partition board extending substantially the length of the air conducting cover from the first air inlet to the first air outlet and located in the first airflow channel, so the first airflow channel is divided into two channels.

3. The cooling system as claimed in claim 1, further comprising a second partition board extending substantially the length of the air conducting cover from the second air inlet to the second air outlet and located in the second airflow channel, so the second airflow channel is divided into two channels.

4. A cooling system, comprising:
a fan;
an air conducting cover comprising a first airflow channel and an opposite second airflow channel, the first airflow channel comprising a first air inlet and an opposite first air outlet, the second airflow channel comprising a second air inlet and an opposite second air outlet; and
a first partition board extending substantially the length of the air conducting cover from the first air inlet to the first air outlet and located in the first airflow channel, so the first airflow channel is divided into two channels;
wherein an airflow generated by the fan simultaneously flows into the first airflow channel and the second airflow channel respectively via the first air inlet and the second air inlet, then out of the first airflow channel and the second airflow channel respectively via the first air outlet and the second air outlet.

5. The cooling system as claimed in claim 4, wherein the air conducting cover includes two sidewalls having inwardly facing wall surfaces and a dividing wall connecting the two sidewalls from an area adjacent the center of their respective inwardly facing wall surfaces, the inwardly facing wall surfaces of the sidewalls and the dividing wall cooperatively form the first airflow channel at one side of the dividing wall and the second airflow channel at an opposite side of the dividing wall.

6. The cooling system as claimed in claim 4, further comprising a second partition board extending substantially the length of the air conducting cover from the second air inlet to the second air outlet and located in the second airflow channel, so the second airflow channel is divided into two channels.

7. An electronic device, comprising:
a chassis;
a fan mounted in the chassis; and
an air conducting cover comprising two sidewalls and a dividing wall, opposite ends of the dividing wall respectively connected to the two sidewalls and defining a first airflow channel at a first side of the dividing wall and an opposite second airflow channel at a second side of the dividing wall, the first airflow channel comprising a first air inlet and an opposite first air outlet, the second airflow channel comprising a second air inlet and an opposite second air outlet;
wherein an airflow generated by the fan simultaneously flows into the first airflow channel and the second airflow channel respectively via the first air inlet and the second air inlet, then out of the first airflow channel and the second airflow channel respectively via the first air outlet and the second air outlet.

8. The electronic device as claimed in claim 7, wherein the two sidewalls have inwardly facing wall surfaces, the dividing wall are connected to the two sidewalls from an area adjacent the center of their respective inwardly facing wall surfaces, the inwardly facing wall surfaces of the sidewalls and the dividing wall cooperatively form the first airflow channel and the second airflow channel.

9. The electronic device as claimed in claim 7, further comprising a first partition board extending substantially the length of the air conducting cover from the first air inlet to the first air outlet and located in the first airflow channel, so the first airflow channel is divided into two channels.

10. The electronic device as claimed in claim 7, further comprising a second partition board extending substantially the length of the air conducting cover from the second air inlet to the second air outlet and located in the second airflow channel, so the second airflow channel is divided into two channels.

* * * * *